(12) United States Patent
Sullivan

(10) Patent No.: US 7,795,860 B2
(45) Date of Patent: Sep. 14, 2010

(54) MULTIPLE PROBE ACQUISITION SYSTEM

(75) Inventor: Steven K. Sullivan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 544 days.

(21) Appl. No.: 11/505,566

(22) Filed: Aug. 16, 2006

(65) Prior Publication Data

US 2008/0042666 A1 Feb. 21, 2008

(51) Int. Cl.
*G01R 31/28* (2006.01)

(52) U.S. Cl. .................................................. 324/158.1

(58) Field of Classification Search .................. 324/754, 324/761–762, 765, 158.1, 72.5; 257/48; 438/14–18; 714/724

See application file for complete search history.

(56) References Cited

U.S. PATENT DOCUMENTS

| 4,042,881 | A | 8/1977 | Webb, Jr. | |
|---|---|---|---|---|
| 4,403,183 | A | 9/1983 | Lueker | |
| 5,223,787 | A | 6/1993 | Smith | |
| 5,225,776 | A | 7/1993 | Dobos | |
| 5,274,336 | A | 12/1993 | Crook | |
| 6,530,887 | B1 | 3/2003 | Gilbert | |
| 7,135,881 | B2 * | 11/2006 | Walker et al. | 324/765 |
| 7,173,443 | B1 * | 2/2007 | Asami | 324/765 |

FOREIGN PATENT DOCUMENTS

| CA | 2342647 | 9/2001 |
|---|---|---|
| EP | 0241142 A | 10/1987 |
| EP | 1335207 A | 8/2003 |
| EP | 1335207A22 | 8/2003 |
| EP | 1359427 A | 11/2003 |
| JP | 7-5201 | 1/1995 |

OTHER PUBLICATIONS

USB-based Electrical Engineer CWAV, Web Manual Data Information, USBee AX Mixed Signal Oscilloscope, Logic Analyzer and More, "USBee AX Test Pod", p. 1-10, Copyright 2006 CWAV.

(Continued)

*Primary Examiner*—Ha Tran T Nguyen
*Assistant Examiner*—Tung X Nguyen
(74) *Attorney, Agent, or Firm*—Francis I. Gray; Thomas F. Lenihan

(57) ABSTRACT

A multiple probe acquisition system, such as for use with a value instrument, uses probes where each probe includes an acquisition circuit for acquiring from a circuit under test an electrical signal as digital data at a high rate, and then transferring the digital data from the probe to the instrument at a lower rate over a data bus for processing and display. The probe may be used to acquire analog waveforms or logic data from the electrical signal. The probe provides a very low input capacitance to the circuit under test, minimizing signal distortion, and is relatively inexpensive. The probes are time aligned by detecting when one of the probes generates a trigger, and timing the other probes to stop acquisition simultaneously so the data is synchronized among the probes.

3 Claims, 4 Drawing Sheets

OTHER PUBLICATIONS

USB-based Electrical Engineer CWAV, Web Manual Data Information, USBee AX Digital Test Pod, p. 1-2, Copyright 2006 CWAV.

PenScope Web Documentation, PenScopeDAQ Pen-type Digital Oscilloscope, Oct. 30, 2004.

PenScope Web Documentation, PenScope osziFOX, Wittig Technologies.

PicoScope 2105, "New USB-Adaptor for PCs Is a Scope-in-a-Probe!", New Product Press Release-Apr. 3, 2006.

LeCroy Oscilloscopes and Protocol Analyzers, Web Data Information, MS-32 Oscilloscope, Copyright LeCroy Corporation, 2006.

* cited by examiner

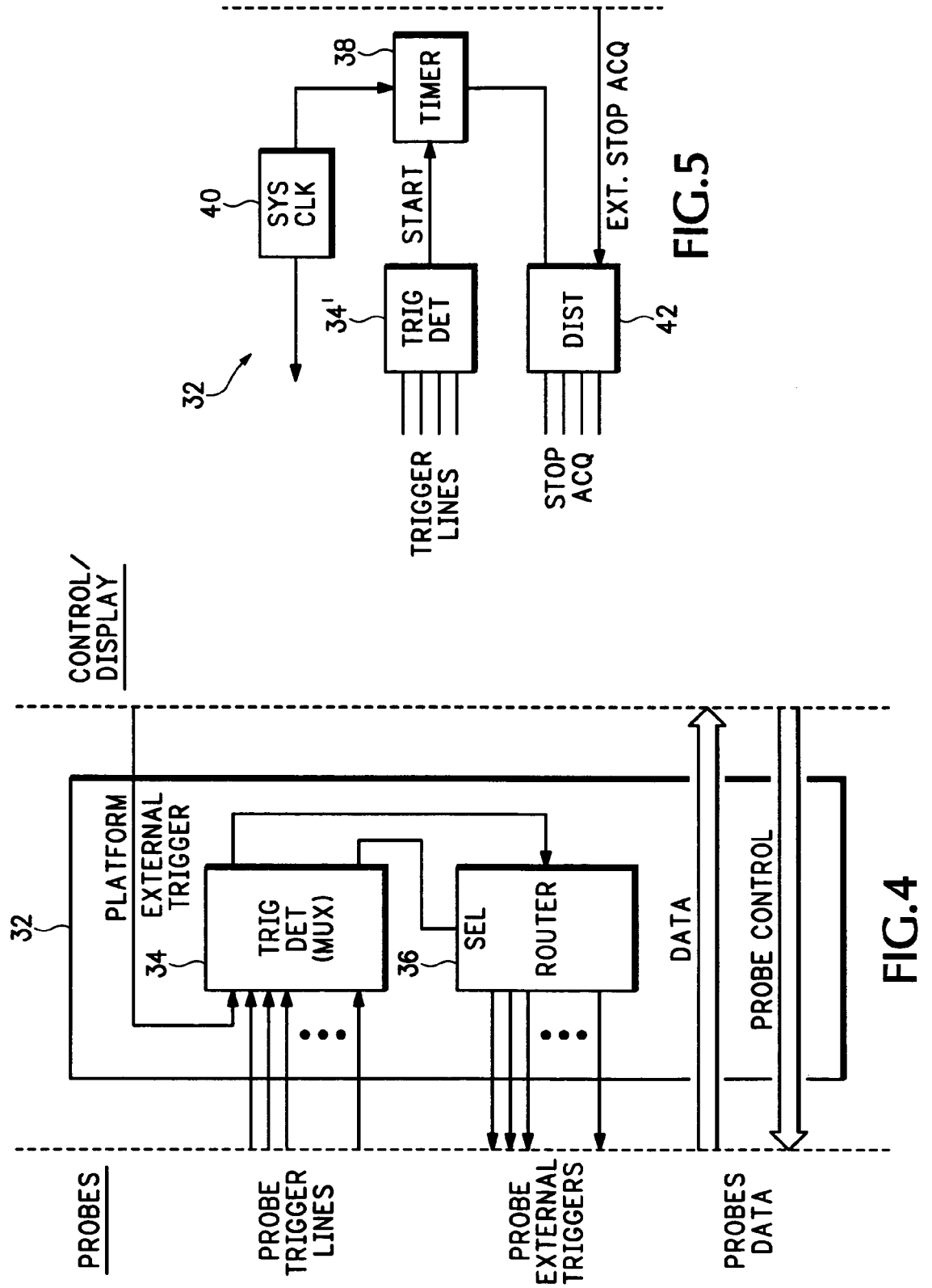

MULTIPLE PROBE ACQUISITION SYSTEM

BACKGROUND OF THE INVENTION

The present invention relates to data acquisition, and more particularly to a multiple probe acquisition system for obtaining synchronized data from self-contained acquisition probes.

In a conventional test and measurement system a probe is used to route an electrical signal via a cable from a circuit under test to an instrument. The instrument, such as an oscilloscope or logic analyzer, includes an acquisition circuit and a trigger circuit to which the cable from the probe is connected. In the acquisition circuit the electrical signal is sampled and digitized, with the resulting data being stored for further processing in an acquisition memory in response to a trigger signal from the trigger circuit. The processed data is then presented as a waveform and/or as alphanumeric information on a display. There are generally two types of probes—passive probes and active probes.

Passive probes rely upon power from the circuit under test to drive the electrical signal from the probe to the acquisition circuit in the instrument over the cable. These probes are relatively inexpensive and are used almost exclusively by value or lower performance instruments. However passive probes present a load to the circuit under test which distorts the electrical signal acquired by the instrument. Further the cable presents an impedance path between the probe and the acquisition circuit which further may distort the electrical signal acquired by the instrument. Finally the cable presents a bandwidth limitation on the signals that may be accurately passed to the instrument. To address this problem passive probes are designed with very low capacitance and the cable is kept as short as possible, but this does not eliminate completely the distortion problem.

Active probes deliver a more accurate waveform display than passive probes, even at the lower frequencies of value instruments. There are two basic reasons for this increase in accuracy, both related to reducing the capacitance of the probe. As indicated above the probe capacitance loads the circuit under test, causing waveform distortion. The probe capacitance also causes alternating current to pass from the circuit under test to the ground lead of the probe. The current in the ground lead then produces a voltage across the ground lead, and inductance in the ground path causes a voltage along the ground lead. The resulting voltage displayed as the waveform is the signal being monitored minus the induced voltage in the ground lead. To reduce the distorting effects of the ground lead, either the ground lead is shortened to reduce the inductance or the probe capacitance is reduced. In many circumstances there are not convenient ways to make low inductance ground paths.

For a high performance instrument active probes have been developed that derive power from the instrument to drive the electrical signal from the probe to the acquisition circuit in the instrument. These probes may include a programmable amplifier and attenuator which receive power and commands from the instrument. The active probes are relatively expensive compared to the passive probes because of the added electronic circuitry, but are small in cost compared to the expense of the high performance instrument. The active probes also are more difficult to use than the passive probes. The reason for more cost is the fact that power, signaling and very high bandwidth signals are passed through the cable. Additionally, the active probes are designed for operation at bandwidths much above those needed for value instruments. Further, although the active probe minimizes loading of the circuit under test, the cable is still a source of signal distortion between the probe and the acquisition circuit in the instrument, especially at high frequencies in the GigaHertz range. Additionally at one watt of power the probe becomes hot, which is not desirable to a user when probing the circuit under test, so the amount of electronics in the active probe is kept to a minimum. Finally most active probes are limited in the voltage range that can be probed as they do not contain attenuators that are controlled by the instrument's volts/division control, and so are not useful for general purpose applications. When an inexperienced user views a signal with too much amplitude, the probe delivers a clipped signal that is displayed as an extremely distorted signal that may fool the user into believing that it is the actual signal present at the probe tip.

For value or lower performance instruments active probes are not generally used because the cost of the active probe is comparable to the cost of the value instrument. Therefore value instruments generally use only passive probes for acquiring signals from the circuit under test.

Recently there have been new products that seek to replace the stand alone low value oscilloscopes. These products are adapted to interact with a personal computer (PC), and therefore include some acquisition circuitry as part of the probe system. One such product is represented by a pen-type single channel digital storage oscilloscope (DSO), such as the PenScope osziFOX® DSO manufactured by Wittig Technologies and the PicoScope® USB Pen Scope manufactured by Pico Technology Limited, that uses a serial interface cable to display recorded signals on the PC screen. Another such product is a USB module to which probes are connected, such as the USBee ZX Digital Test Pod manufactured by CWAV or the MS-32 Oscilloscope Mixed Signal Option manufactured by LeCroy Corporation, which performs triggering and data acquisition and communicates with the PC or a test instrument.

When multiple probes are grouped together to monitor different portions of the circuit under test, each probe has its own trigger circuit. However there is no system that allows synchronization of data from the multiple probes so that a user can see what is happening at each probe location when a trigger event occurs. In otherwords, each probe system operates independently of any other probe systems.

What is desired is a probe system for lower performance, value instruments that is general purpose, i.e., good dynamic range controlled from the instrument, low cost and less capacitance to minimize loading of the circuit under test, and that is able to synchronize data acquisition with other probe systems.

BRIEF SUMMARY OF THE INVENTION

Accordingly the present invention provides a multiple probe acquisition system, each probe containing an acquisition circuit including a trigger generator, that synchronizes data from all of the probes in response to a trigger signal from one of the probes. Each probe, whether an analog probe that digitizes the electrical signal from a single channel to form data samples or a logic probe that converts the electrical signal from multiple channel into logic data, contains an acquisition circuit for capturing data at a high rate at the probe and then transferring the data at a low rate from the probe to a control and display platform, such as a test instrument or a personal computer (PC), for processing and display. The probes are connected to a separate hub or its equivalent built into the control and display platform so that the control and display platform communicates with the probes. The probes provide data and a trigger line as outputs and receive power, commands and a system clock as inputs. The hub detects when there is a trigger signal on one of the trigger lines and stops acquisition of data at all of the probes at the same so that the data captured in the probes is time aligned with the data from all of the other probes. The time aligned data is then transferred from the probes to the control and display platform.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 4 is a simplified block diagram view of a first embodiment of a synchronizer for the multiple probe acquisition system according to the present invention.

FIG. 5 is a simplified block diagram view of a second embodiment of a synchronizer for the multiple probe acquisition system according to the present invention.

DETAILED DESCRIPTION OF THE INVENTION

Figure 1:
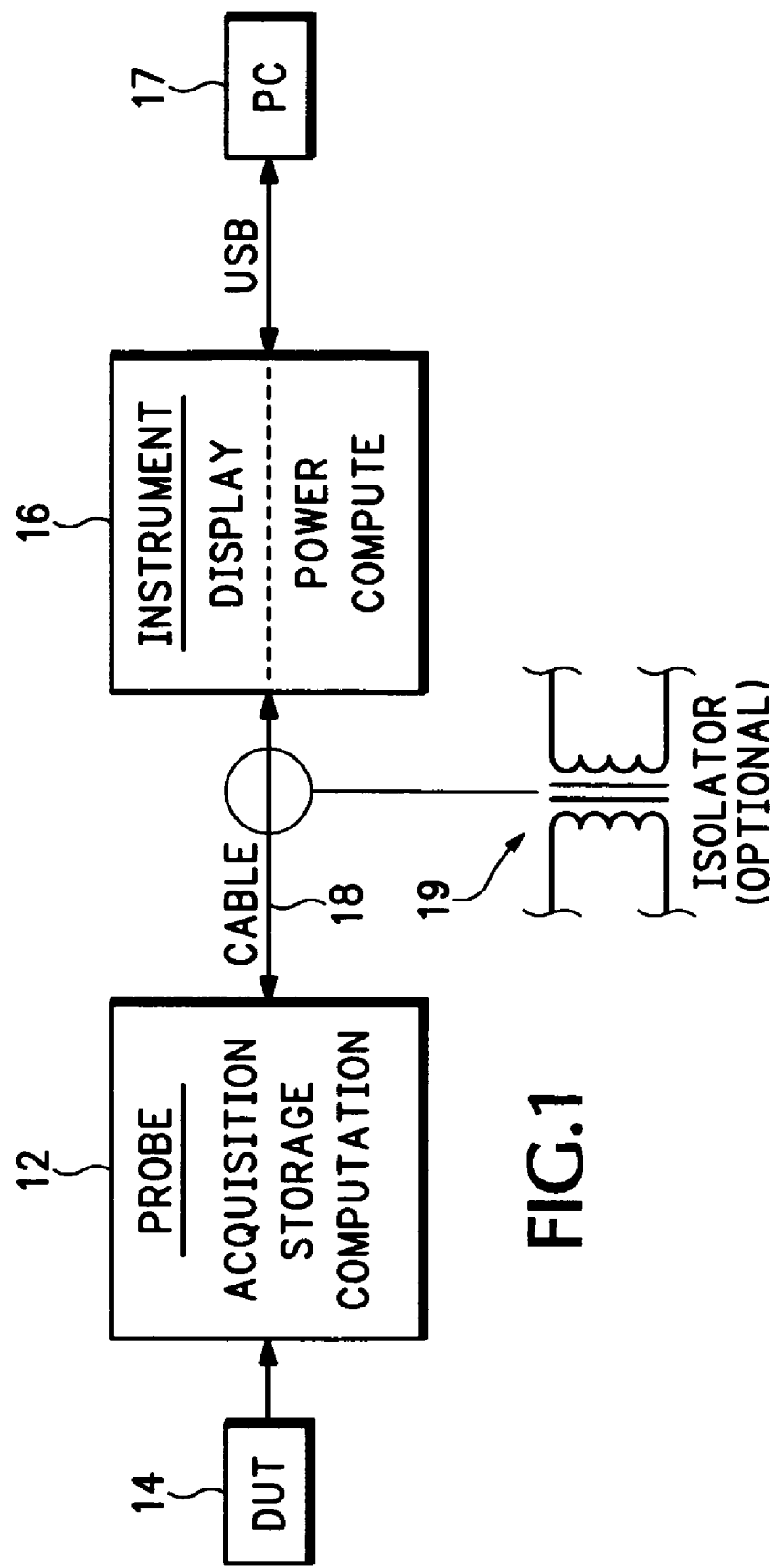
FIG. 1 is block diagram view of a single channel system using an active probe suitable for use in a multiple probe acquisition system according to the present invention.

Referring now to FIG. 1 an active probe 12, as described in more detail below, is coupled to a device under test (DUT) 14 for routing an electrical signal from the DUT to a test instrument 16 via a cable 18. The active probe 12 has active circuitry including programmable front end amplifiers for extracting the electrical signal from the DUT 14. The power for the probe active circuitry is provided by the test instrument 16 via the cable 18. Added to the active circuitry in the probe 12 is a programmable passive attenuator and an acquisition circuit that includes for sampling analog signals a digitizer, storage, some computational capability and a trigger system. The acquisition circuit includes the ability to sample the electrical signal at a high rate, i.e., at the electrical signal rates for GigaHertz signals, to store the sampled data and then to transfer the sampled data from storage to the test instrument 16 at a slower rate in synchronization with the test instrument timing to provide a fast in, slow out (FISO) capability. The data may be transferred using a high resolution serial protocol, such as the universal serial bus (USB) protocol. Isolation may be provided by an isolator 19 placed between the probe 12 and the instrument 16 to provide for floating measurements. The isolator 19 contains a direct current-to-direct current (DC-DC) power supply to provide isolated power for the probe. Since only low voltage digital signals are passed from the probe 12 to the instrument 16, the shock hazard potential when making floating measurements is virtually eliminated. Conceptually a wireless link, such as Bluetooth technology, may be used instead of the cable 18 between the probe 12 and the instrument 16.

Figure 2:
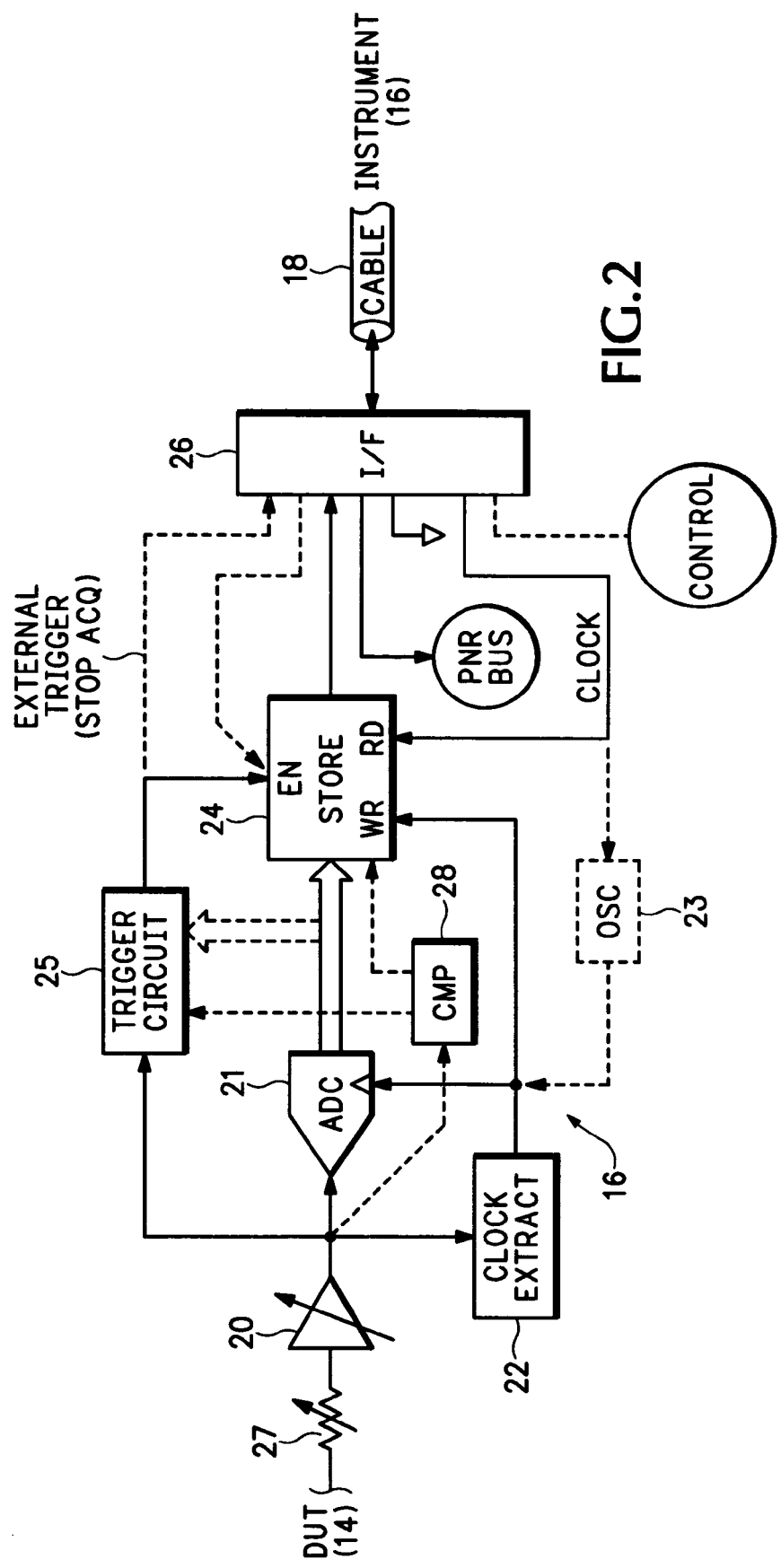
FIG. 2 is a block diagram view of an active probe suitable for use in the multiple probe acquisition system according to the present invention.

As shown in FIG. 2 the electrical signal from the DUT 14 is input to a general version of the active probe 12 having a programmable amplifier 20 at the front end that provides buffering to minimize loading on the circuit being probed and provides bandwidth limiting. A passive programmable attenuator 27 is situated before the programmable amplifier 20 to provide a wide dynamic range for general purpose applications by providing the ability to reduce a big signal to a level that the amplifier can manage. For analog signals the buffered, attenuated signal is then input to an analog-to-digital converter (ADC) 21 to produce digital data samples, typically 8-10 bits per sample. The ADC 21 is clocked by a high speed clock, provided by an internal oscillator 23 that may be locked to a lower frequency signal received from the instrument 16 or possibly by a clock extraction circuit 22 from the signal itself. The digital data is then stored in a storage unit 24 using the high speed clock, the storage unit being in the form of a recirculating memory. A trigger circuit 25 derives a trigger signal from the buffered, attenuated signal or from the digital data to stop storage of the digital data a specified time interval after a defined trigger event. The contents of the storage unit 24 are then read out and transferred via a data bus interface 26 through the cable 18 to the test instrument 16 as a serial digital signal in response to a command provided by the test instrument. The test instrument 16 provides the control signals for the programmable amplifier 20, attenuator 27 and the trigger circuit 25.

The ability to condense the acquisition circuitry to a small enough size to fit in the probe 12 is the result of improvements made in complementary metal oxide semiconductor (CMOS) technology. A modern 0.13 micron chip is about 35 times denser than the conventional 0.8 micron chip, and power is reduced significantly because of a reduction in capacitance and a reduction in operating voltage. Using the 0.13 micron process reduces on-chip memory size needed to double buffer a 100 k sample data record to a region about 4 mm per side. Compared to the diameter of passive probes, which is about 10 mm where the cable enters the probe, there is plenty of surface area to contain the acquisition system. The only limitation is storage size, as more storage requires more power and the amount of power required by the probe is kept to a level that does not generate too much heat.

Figure 3:
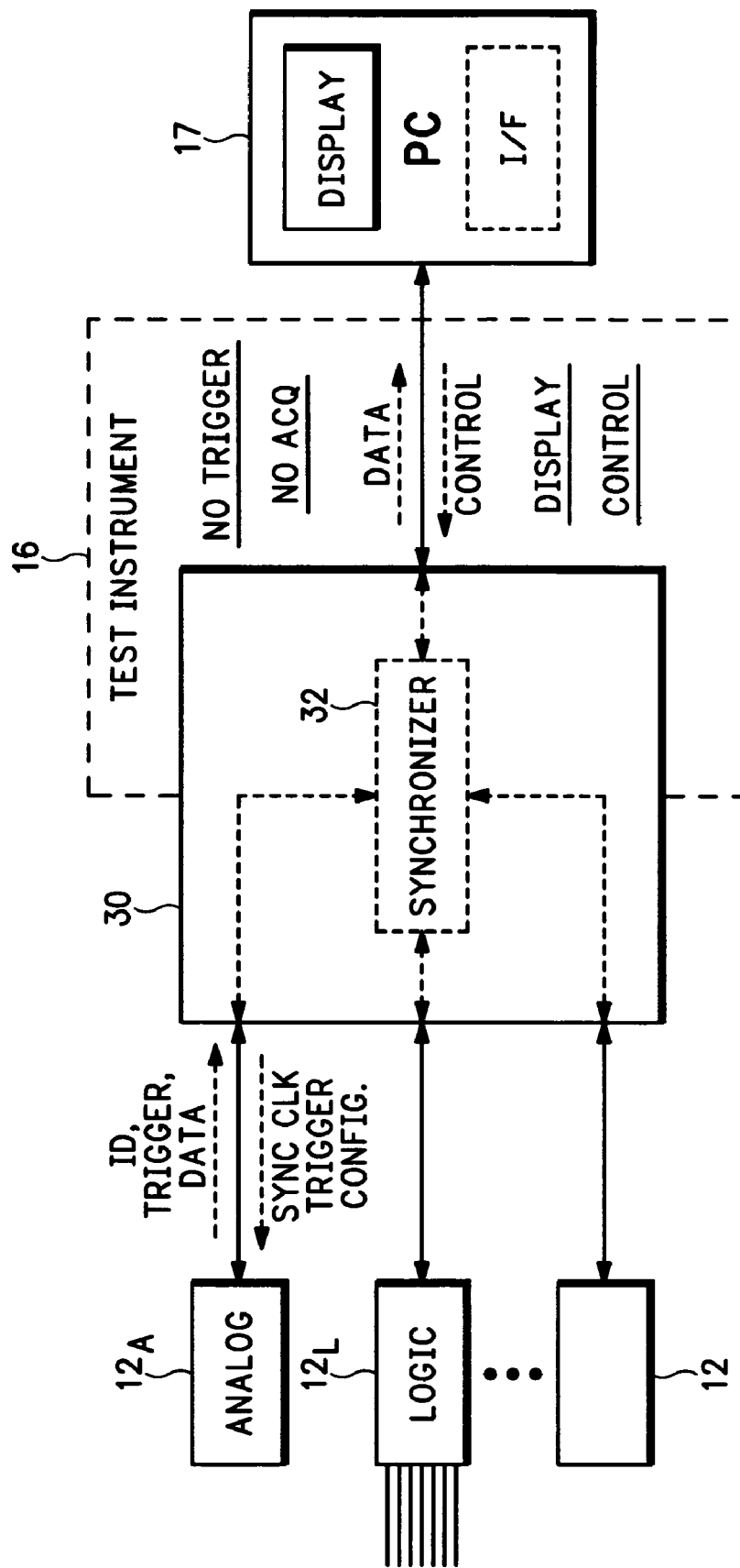
FIG. 3 is a block diagram view of a multiple probe acquisition system according to the present invention.

As shown in FIG. 3 the instrument 16 may be nothing more than a hub 30 that connects the probe 12 to a personal computer (PC) 17. The display and computational ability of the instrument 16 are provided by the PC 17, and the hub 30 merely provides the power to the probe 12 as well as relaying instructions from the PC to the probe 12.

By placing the acquisition system into the probe 12, the probe interconnect may be made smaller, as a USB connector is much smaller than a standard BNC connector. The serial bus not only passes the waveform data, but also passes a probe identifier. The probe identifier provides information about the probe characteristics such as type of probe, bandwidth, dynamic range, etc. when the probe is first connected to the hub or instrument. The probe interconnect also is designed to disconnect when the probe 12 is accidently yanked so that the instrument 16 is not pulled onto the floor. Further, since most of the cost of the acquisition system is in the probe 12 and the interconnect is small, the instrument 16 may be designed to accept many more probes than in a conventional instrument, i.e., up to eight or more. The instrument 16 communicates with one probe at a time, which does reduce waveform data throughput.

The probe 12 shown in FIG. 2 may be a logic probe with the addition of a group of comparators 28 at the front end to convert the input signals to logical "1"s and "0"s. The connection from the output of the comparators 28 to the acquisition system bypasses the ADC 21, allowing the logic data to be captured directly instead of as a digitized value. However essentially the same acquisition system is used as in the general analog probe. The trigger circuit 25 includes logic triggering that may not be used when acquiring analog waveforms. The probe 12 may support eight logic channels, and multiple probes may be connected to the instrument 16 to allow, for example, up to 64 or more channels to be observed. Triggering is limited to a single probe at any time. Having the comparators 28 at the probe 12 reduces the input capacitance, resulting in less circuit loading and less distortion due to the ground lead.

Where multiple probes 12 are coupled to a hub 30 or instrument 16 and each probe acquires data independently, there is a problem time aligning data captured by one probe in response to a trigger event detected by that probe with data captured by the other probes. Therefore the hub 30 includes a synchronizer 32 that receives a trigger line from each of the probes and operates to stop the acquisition by all of the probes at the same time so that the respective data are time aligned with each other. The synchronizer 32, as shown in FIG. 4, may be in the form of a trigger detector 34 that detects when a trigger occurs at one of the probes to generate an external trigger for the other probes. In this instance the trigger detector 34 also generates a control signal that indicates to which probes the external trigger is to be routed, i.e., to all of the probes except the one which generated the trigger. A router 36 distributes the external trigger according to the control signal, and the probes 12 are set up so that the time from receipt of the external trigger to stopping of acquisition is less than for an internal trigger to compensate for the time required for the trigger to travel from one probe and return to the other probes as the external trigger. Alternatively, as shown in FIG. 5, the trigger detector 34' may use the trigger to start a timer 38 clocked by the system clock 40 to generate a stop command for distribution (42) to all of the probes so they all stop acquiring data at the same time, i.e., all of the data from one probe to the others is time aligned.

Thus the present invention provides a multiple probe acquisition system that includes probes, each with an acquisition circuit that acquires an electrical signal at a high rate and forwards the acquired data to an instrument at a lower rate, that minimizes loading on a circuit under test, that minimizes signal distortion as a result, and that provides time alignment between the probes.

What is claimed is:

1. A probe for use in a multiple probe acquisition system comprising:
   an acquisition system for acquiring and storing in response to a trigger signal an electrical signal from a device under test as digital data at a high rate; and
   a cable for transferring the digital data and the trigger signal from the probe acquisition system to a control and display platform at a low rate and for transferring power, control information and an external trigger signal from the control and display platform to the probe acquisition system; wherein
   the digital data comprises digitized data samples; wherein
   the acquisition system comprises:
   an analog-to-digital converter for converting the electrical signal to the digitized data samples; and
   a storage device for storing the digitized data samples in a recirculating manner; and wherein
   the acquisition system includes a trigger circuit for recognizing from the electrical signal a trigger event to generate the trigger signal for stopping storage of the digitized data samples in a recirculating storage device after a specified time interval.

2. The probe as recited in claim 1, wherein the acquisition system further comprises:
   a programmable amplifier for conditioning the electrical signal; and
   a passive, programmable attenuator for adjusting the amplitude of the electrical signal before input to the programmable amplifier.

3. The probe as recited in claim 1 wherein the digital data comprises logic data.

* * * * *